(12) United States Patent
Lu

(10) Patent No.: US 7,238,605 B2
(45) Date of Patent: Jul. 3, 2007

(54) CIRCUIT STRUCTURES AND METHODS OF FORMING CIRCUIT STRUCTURES WITH MINIMAL DIELECTRIC CONSTANT LAYERS

(75) Inventor: Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/376,795

(22) Filed: Mar. 16, 2006

(65) Prior Publication Data
US 2006/0157814 A1 Jul. 20, 2006

Related U.S. Application Data

(63) Continuation of application No. 10/676,338, filed on Sep. 30, 2003, now Pat. No. 7,045,452.

(51) Int. Cl.
*H01L 21/4763* (2006.01)
(52) U.S. Cl. ............... 438/623; 257/499; 257/E23.117; 438/107
(58) Field of Classification Search .............. 438/623, 438/107; 257/E21.571, E23.117, E23.119, 257/499, E21.576
See application file for complete search history.

(56) References Cited

U.S. PATENT DOCUMENTS

| 4,623,577 | A |  | 11/1986 | Hsiue et al. |
| 5,358,992 | A | * | 10/1994 | Dershem et al. ............ 524/439 |
| 5,501,755 | A |  | 3/1996 | Dahlquist |
| 5,718,941 | A |  | 2/1998 | Dershem et al. |
| 5,858,869 | A | * | 1/1999 | Chen et al. ................. 438/597 |
| 5,887,345 | A |  | 3/1999 | Kulesza et al. |
| 6,093,636 | A |  | 7/2000 | Carter et al. |
| 6,198,284 | B1 | * | 3/2001 | Doty .......................... 324/318 |
| 6,660,618 | B1 | * | 12/2003 | Chen et al. ................. 438/584 |
| 6,663,946 | B2 |  | 12/2003 | Seri et al. |
| 6,824,642 | B2 | * | 11/2004 | Walter et al. ............ 156/331.5 |
| 2002/0195687 | A1 |  | 12/2002 | Brooks et al. |
| 2003/0176616 | A1 | * | 9/2003 | Bauer et al. .................. 528/44 |
| 2004/0195967 | A1 |  | 10/2004 | Padiyath et al. |

* cited by examiner

*Primary Examiner*—Caridad Everhart
(74) *Attorney, Agent, or Firm*—Blakely, Sokoloff, Taylor & Zafman LLP

(57) ABSTRACT

An apparatus including a contact point formed on a device layer of a circuit substrate or an interconnect layer on the substrate; a first dielectric material; and a different second polymerizable dielectric material on the substrate and separated from the device layer or the interconnect layer by the first dielectric material following polymerization, the second dielectric material comprising a glass transition temperature of at least 250° C. and a thermal decomposition temperature of at least 400° C. A method including depositing a dielectric material and thermally treating the dielectric material at a temperature greater than the thermal decomposition temperature.

11 Claims, 2 Drawing Sheets

CYANATE ESTER MONOMER

POLYCYANURATE

CIRCUIT STRUCTURES AND METHODS OF FORMING CIRCUIT STRUCTURES WITH MINIMAL DIELECTRIC CONSTANT LAYERS

This application is a continuation of U.S. patent application Ser. No. 10/676,338, filed Sep. 30, 2003, now U.S. Pat No. 7,045,452 issued May 16, 2006, entitled "Circuit Structures and Methods of Forming Circuit Structures with Minimal Dielectric Constant Layers."

BACKGROUND

1. Field

Integrated circuit processing.

2. Background

Modern integrated circuits use conductive interconnections to connect the individual devices on a chip or to send or receive signals external to the chip. Popular types of interconnections include aluminum alloy interconnections and copper or copper alloy interconnections.

One process used to form interconnections, particularly copper or copper alloy interconnections, is a damascene process. In a damascene process, a trench is cut in a dielectric and filled with copper to form the interconnection. A via may be in the dielectric beneath the trench with a conductive material in the via to couple the interconnection to underlying integrated circuit devices or underlying interconnections. In one damascene process (a "dual damascene process"), the trench and via are each filled with copper material by, for example, a single deposition.

A photoresist is typically used over the dielectric to pattern a via or a trench or both in the dielectric for the interconnection. After patterning, the photoresist is removed. The photoresist is typically removed by an oxygen plasma (oxygen ashing). The oxygen used in the oxygen ashing can react with an underlying copper interconnection and oxidize the interconnection. Accordingly, damascene processes typically employ an etch stop layer of silicon nitride ($Si_3N_4$) directly over the copper interconnection to protect the copper from oxidation during oxygen ashing in the formation of a subsequent level interconnection. In intelayer interconnection levels (e.g., beyond a first level over a device substrate), the etch stop layer also protects against misguided or unlanded vias extending to an underlying layer or level.

In general, the $Si_3N_4$ etch stop layer is very thin, for example, roughly 10 percent of the thickness of the pre-metal dielectric (PMD) layer or interlayer dielectric (ILD) layer. A thin etch stop layer is preferred primarily because $Si_3N_4$ has a relatively high dielectric constant (k) on the order of 6 to 7. The dielectric constant of a dielectric material, such as an interlayer dielectric, generally describes the parasitic capacitance of the material. As the parasitic capacitance is reduced, the cross-talk (e.g., a characterization of the electric field between adjacent interconnections) is reduced, as is the resistance-capacitance (RC) time delay and power consumption. Thus, the effective dielectric constant ($k_{eff}$) of a PMD layer or ILD layer is defined by the thin etch stop layer and another dielectric material having a lower dielectric constant so that the effect of the high dielectric material typically used for the etch stop layer (e.g., $Si_3N_4$) is minimized.

DETAILED DESCRIPTION

Figure 1:
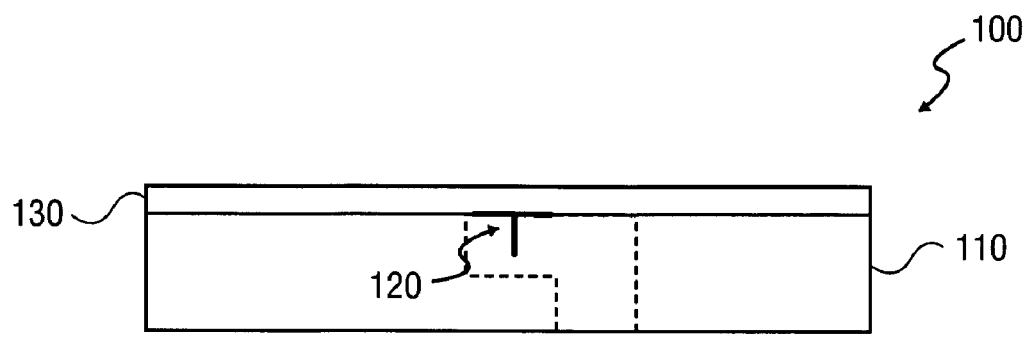
FIG. 1 is a schematic side view of a portion of a circuit substrate or interconnect layer on a substrate including a contact point and a first etch stop layer formed over the contact point.
Figure 2:
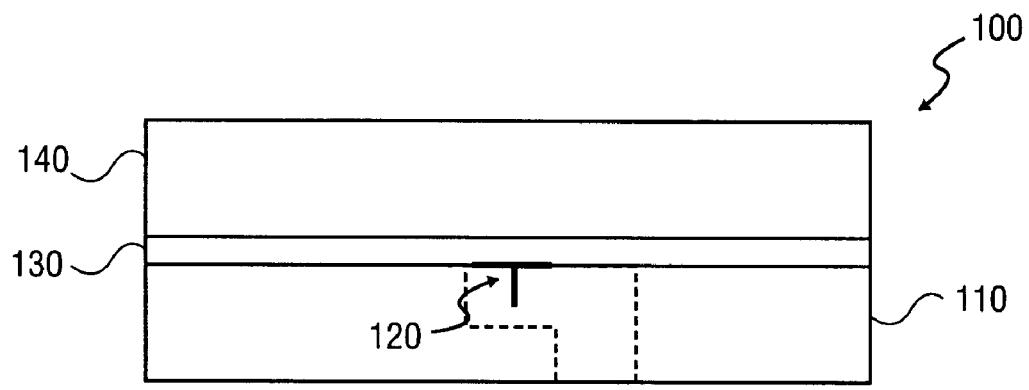
FIG. 2 shows the structure of FIG. 1 following the formation of a dielectric layer on the first etch stop layer.
Figure 3:
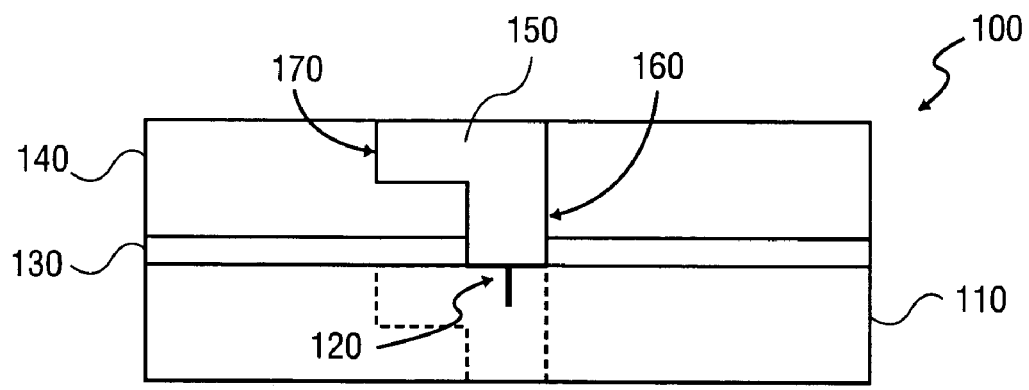
FIG. 3 shows the structure of FIG. 2 following the formation of an interconnection to the contact point.

FIGS. 1 to 3 illustrate a dual damascene process for forming an interconnection over a contact point. A contact point is, for example, a device on a substrate (e.g., gate, junction, etc.). Alternatively, in a multi-level interconnection device configuration, the contact point also includes an underlying interconnection (e.g., an interconnection line). A typical integrated circuit of a microprocessor may have, for example, five or more interconnection layers or lines stacked on one another, each insulated from one another by dielectric material.

FIG. 1 illustrates a cross-sectional, schematic side view of a portion of a circuit substrate structure. Structure 100 includes substrate 110 of, for example, a semiconductor material such as silicon or a semiconductor layer on an insulator such as glass. Substrate 110, as viewed, may also include a device layer and one or more dielectric layers formed thereon with interconnections disposed therethrough. Substrate 110 includes contact point 120 on a surface thereof. In one embodiment, contact point 120 is a portion of an underlying interconnect line (e.g., a metal trench). A representative interconnect line is shown in dashed lines. Overlying contact point 120 and substrate 110, in one embodiment, is etch stop layer 130. Etch stop layer 130 is selected, in one embodiment, to be a material having a dielectric constant (k) less than on the order of about five. In the context of a contact point that is a copper interconnection (e.g., interconnection line), etch stop layer 130 is selected to have relatively good copper diffusion characteristics (i.e., to inhibit copper diffusion). Etch stop layer 130 is also selected such that it is a material that has an etch characteristic such that it may be selectively etched or retained during an etch operation involving a subsequently introduced dielectric material, such as a dielectric material that, together with barrier material 130, will serve as a pre-metal dielectric (PMD) or interlayer dielectric (ILD) layer dielectric material.

A suitable material for etch stop layer 130 is a material that will be sufficiently strong or sturdy to remain in the absence of a supporting material. A suitable material should also have a relatively low dielectric constant so that its contribution to an overall dielectric constant ($k_{eff}$) is minimized. Further, the material for etch stop layer 130 should be selectively etchable in the presence of another dielectric material. Suitable materials include silicon dioxide ($SiO_2$) or silicon nitride ($Si_3N_4$). Each of these materials may be introduced by chemical vapor deposition (CVD) and tend to serve as an inhibitor of copper diffusion when used as the barrier material in the context of copper.

In one embodiment, etch stop layer 130 of either $SiO_2$ or $Si_3N_4$ is introduced, according to current technologies, to a thickness on the order of 40 nanometers (nm) to 100 nm. The thickness is selected, in one example, to be sufficient to protect an underlying contact point (e.g., contact point 120 (e.g., device or copper interconnection line)), but not to unacceptably increase the capacitance between contact point 120 and, for example, an overlying or adjacent interconnection (e.g., thickness selected to minimize the contribution of etch stop layer 130 to $k_{eff}$).

Overlying etch stop layer 130 in the illustration shown in FIG. 2 is dielectric layer 140 deposited to a thickness on the order of approximately 700 nanometers according to current technologies. The thickness of dielectric layer 140 will depend, in part, on size characteristics and scaling considerations for the structure. Dielectric layer 140 is, in one embodiment, selected of a material that may decompose, for example, in response to a thermal treatment acceptable to substrate 110 and any device layers and/or interconnect layers formed thereon. Thus, in one embodiment, dielectric material 140 is a sacrificial material that may be substantially removed in characterizing the final circuit structure. In one embodiment, a material for dielectric layer 140 has a glass transition temperature of at least 250° C. and a thermal decomposition temperature of at least 400° C. Representatively, a suitable material for dielectric layer 140 has a thermal decomposition temperature between 400° C. and 500° C. In one embodiment, a material for dielectric layer is polymerizable such that it may be deposited in a monomeric state, or partially polymerized state, and then substantially or completely polymerize, for example, upon exposure to heat or radiation, on substrate 110 to form dielectric layer 140. In one embodiment, a material for dielectric layer 140, after polymerization, has an elastic modulus greater than 3 gigaPascal (GPa) and a hardness greater than 0.3 GPa. A suitable material for dielectric layer 140 is a polycyanurate material.

Collectively, etch stop layer 130 and dielectric layer 140 define a composite dielectric layer. Once dielectric layer 140 is deposited and formed (e.g., polymerized), the material may be planarized, for example, with a polish (e.g., chemical-mechanical polish).

Referring to FIG. 3, following the introduction of dielectric layer 140, an opening is made to contact point 120. In one embodiment, the opening includes via 160 and trench 170 formed, for example, by sequential photolithographic patterning and etching operations. Representatively, what is shown is a dual damascene process where via 160 and trench 170 are formed as the opening and are filled with conductive material 150 such as a copper material and the conductive material in trench 170 serves as an interconnection line. Thus, although not shown in the cross sectional view of FIG. 3, trench 170 may extend into the page as viewed to act as a trench for a conductive material interconnection line to reside therein. In addition to conductive material of, for example, a copper material in via 160 and trench 170, one or more layers may be deposited along the sidewalls of via 160 and trench 170 to, for example, inhibit diffusion of the conductive material and/or improve adhesion of the conductive material.

Via 160 and trench openings are made through dielectric layer 140 and etch stop layer 130. To form an opening through dielectric layer 140, a suitable etch process is selected that does not substantially react or disrupt underlying etch stop layer 130. In the case of dielectric layer 140 of a polycyanurate and etch stop layer 130 of $Si_3N_4$, a suitable etching process to etch polycyanurate is, for example, a $O_2$ or $SF_6/O_2$ plasma etching. With such an etching process, an etch of dielectric layer 140 will proceed through the material and substantially stop when etch stop layer 130 is exposed. A subsequent etch chemistry, such as a fluorine-carbon (e.g., $CF_4/O_2/H_2$, $C_2F_6$, $C_3F_8$, or $CHF_3$) plasma can then be used to form an opening through etch stop layer 130 and expose contact point 120.

Figure 4:
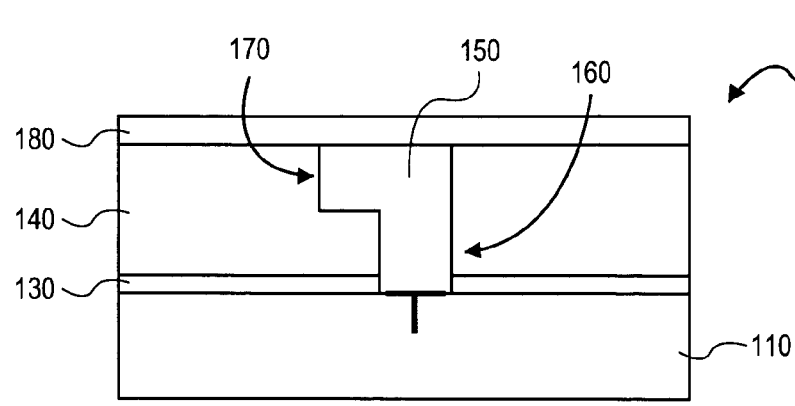
FIG. 4 shows the structure of FIG. 2 following the formation of a second etch stop layer on the dielectric layer and interconnection.

FIG. 4 shows the structure of FIG. 3 following the deposition and formation of etch stop layer 180. In one embodiment, etch stop layer 180 is similar to etch stop layer 130 (e.g., $SiO_2$, $Si_3N_4$) deposited to a similar thickness (e.g., on the order of 40 nm). Etch stop layer 180 overlies dielectric layer 140 and trench 170 (as viewed). In this manner, dielectric layer 140 is disposed between etch stop layer 130 and etch stop layer 180.

Figure 5:
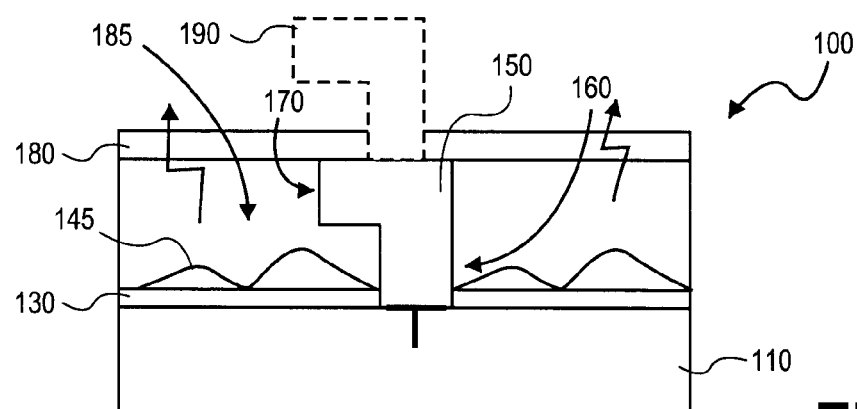
FIG. 5 shows the structure of FIG. 4 following the optional formation of a subsequent dielectric layer on the second etch stop layer and an optional interconnection, and also shows the structure after a thermal decomposition of the dielectric layer.

FIG. 5 shows the structure of FIG. 4 and illustrates the optional formation of subsequent interconnection layer or line, illustrated by conductive material 190 (shown in ghost lines) overlying conductive material 150. It is appreciated that conductive material 190 of, for example, a via and trench, may be encapsulated in dielectric material, such as dielectric material similar to a dielectric material of dielectric layer 140, at least initially (see FIG. 4). Conductive material 190 may be connected to an underlying (as viewed) interconnection, such as conductive material in trench 170.

FIG. 5 also shows a transformation of dielectric layer 140. In one embodiment, structure 100 is disposed to a thermal treatment whereby the structure is heated to a temperature greater than the thermal decomposition temperature of a material for dielectric layer 140 and any subsequent similar dielectric layer. Referring to FIG. 5, the thermal treatment decomposes a material serving as a dielectric layer, such as dielectric layer 140 leaving a void or an air gap between etch stop layer 130 and etch stop layer 180. In one embodiment, any volatiles generated from the decomposition tend to defuse through the etch stop layer, such as etch stop layer 180. FIG. 5 shows air gap or void 185. By leaving an air gap or void substantially in the volume previously occupied by dielectric layer 140, the composite dielectric constant ($k_{eff}$) may be substantially reduced (e.g., air providing a near zero contribution to $k_{eff}$). Certain materials for dielectric layer 140, such as polycyanurate tend to leave a char on decomposition. FIG. 5 shows char 145 on etch stop layer 130. In one embodiment, a material for dielectric layer 140 is selected such that any char 145 is not electrically conductive.

Figure 6:
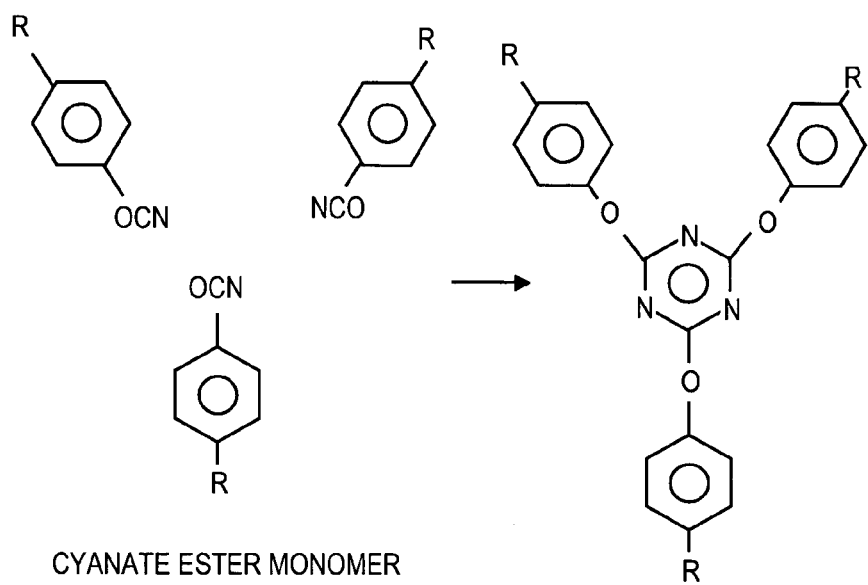
FIG. 6 shows a representation of cyanate ester monomers and the formation of a polycyanurate.

FIG. 6 illustrates the formation of a polycyanurate moiety suitable as a material for a dielectric layer, such as dielectric layer 140 illustrated above in FIGS. 1–4. A polycyanurate material is formed, in this embodiment, from cyanate ester monomers. Cyanate ester monomers may be dissolved in a solvent such as a methyl ethyl keytone (MEK) solvent. The solution may be applied to a substrate, such as by spinning. Once deposited on the substrate, any solvent may be thermally removed and the material cured to form cross-link polycyanurate moiety materials (polymers).

Table I shows properties of some suitable polycynaurate materials:

| Cyanate Ester Monomers | Tg (° C.) | Peak weight loss rate temp (° C.) |
|---|---|---|
| Bisphenol A cyanate ester | 257 | 468 |
| Bisphenol E cyanate ester | 258 | 467 |
| Hexafluorobisphenol A cyanate ester | 275 | 461 |
| Phenol novolac cyanate ester | >350 | 462 |

To study the electrical conductivity of a char formed after decomposition of a polycyanurate material, an experiment was conducted to determine an electrical resistance of the char.

A novolac cyanate ester generally forms a char after decomposition. A novolac cyanate ester resin (Arocy XU-371, from Vantico Inc.) was coated on an aluminum foil, cured and thermally decomposed at about 475° C. The aluminum foil was then peeled off and a thin layer of char was used for electrical measurement. The electrical resistance of the char was measured using a Keithley 580 ohm micrometer with a four-point probe which has a measurement range of 10 µohm to 200 kohm.

Results: The electrical resistance of the char exceeds the upper limit of the meter, which means the resistance is higher than 200 kohm and the char is not conductive.

In the preceding detailed description, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. An apparatus comprising:
   a contact point formed on a device layer of a circuit substrate or an interconnect layer on the circuit substrate;
   a first dielectric material in direct contact with the circuit substrate or the interconnect layer;
   a different second polymerizable dielectric material on the first dielectric material and in direct contact with the first material wherein, following polymerization, the second dielectric material comprises a glass transition temperature of at least 250° C. and a thermal decomposition temperature of at least 400° C.; and
   a conductive region extending from the second dielectric material and the first dielectric material to reach the contact point.

2. The apparatus of claim 1, wherein the second dielectric material, after polymerization, comprises an elastic modulus greater than 3 GPa.

3. The apparatus of claim 1, wherein the second dielectric material comprises a polycyanurate moiety.

4. The apparatus of claim 1, wherein after a thermal treatment at a temperature greater than a thermal decomposition temperature of the second dielectric material, the second dielectric material comprises a residue of a volume less than a volume of the second dielectric material prior to exposure to the thermal decomposition temperature.

5. The apparatus of claim 1, wherein the conductive region is formed by a trench and a via beneath the trench, both filled with a conductive material.

6. A method comprising:
   depositing a first dielectric material on a circuit substrate comprising a device layer or a device layer and at least one interconnect layer;
   depositing a different second polymerizable dielectric material on the first dielectric material and in direct contact with the first dielectric material, the second dielectric material comprising a glass transition temperature of at least 250° C. and a thermal decomposition temperature of at least 400° C.;
   forming a conductive region extending from the second dielectric material and the first dielectric material to reach the contact point; and
   thermally treating the substrate at a temperature greater than the thermal decomposition temperature of the second dielectric material.

7. The method of claim 6, further comprising, following depositing, polymerizing at least a portion of the second dielectric material.

8. The method of claim 7, wherein the second dielectric material is separated from the substrate by the first dielectric material.

9. The method of claim 7, wherein after polymerizing, the second dielectric material comprises an elastic modulus greater than 3.

10. The method of claim 9, wherein the second dielectric material comprises a polycyanurate moiety.

11. The method of claim 9, wherein forming a conductive region comprises:
    forming a trench and a via beneath the trench; and
    filling the trench and the via with a conductive material.

* * * * *